United States Patent [19]

Ports

[11] Patent Number: 4,529,314

[45] Date of Patent: Jul. 16, 1985

[54] METHOD OF MEASURING MISALIGNMENT BETWEEN LEVELS ON A SUBSTRATE

[75] Inventor: Kenneth A. Ports, Indialantic, Fla.

[73] Assignee: Harris Corporation, Melbourne, Fla.

[21] Appl. No.: 141,451

[22] Filed: Apr. 18, 1980

[51] Int. Cl.³ .............................................. G01B 11/14
[52] U.S. Cl. ................................. 356/375; 356/396; 356/401
[58] Field of Search .................... 356/399–401, 356/395–396, 375; 250/561; 237 R; 364/559

[56] References Cited

U.S. PATENT DOCUMENTS 3,748,043 7/1973 Zipin .................................... 356/396
3,861,798 1/1975 Kobayashi et al. .................... 355/61
4,074,131 2/1978 Schwebel ............................. 356/395

OTHER PUBLICATIONS

Russell et al., "A Comparison of Electrical & Visual Alignment Test Structures for Evaluating Photomask Alignment in Integrated Circuit Manufacturing", International Electron Devices Meeting: Tech. Digest, Wash. D.C., 1977, pp. 7A–7F.

Primary Examiner—William H. Punter
Attorney, Agent, or Firm—Barnes & Thornburg

[57] ABSTRACT

The numerical position relative to a reference indicia of two most nearly aligned overlapping indicia on two separate levels is multiplied by the difference in spacing of the indicia of the patterns on the two levels to determine the degree of misalignment of the levels.

5 Claims, 5 Drawing Figures

METHOD OF MEASURING MISALIGNMENT BETWEEN LEVELS ON A SUBSTRATE

BACKGROUND OF THE INVENTION

The present invention relates generally to alignment techniques and more specifically to an improved visual technique for measuring misalignment between levels on a wafer.

To align a mask relative to a previously formed layer, the mask is adjusted until an indicia pattern on the mask is aligned with the indicia on the substrate formed in the previously formed layer. As explained in U.S. Pat. No. 3,861,798, the accuracy of the alignment technique between the indicia on a mask and the indicia on a substrate is limited by the resolution power of the microscope. Because the two indicia are separated one above the other, the microscope must have a depth of focus large enough to focus both elements at the same time. As the depth of focus of the microscope is increased, the resolution power decreases. Thus, precision in the range of 1 micron is possible for substrate-to-mask separation of 5 to 25 microns. To avoid this problem, U.S. Pat. No. 3,861,798 deals with interference or moire patterns. The technique disclosed therein is where the mask is positioned until the moire patterns produced by the superimposed indicia of the mask and that of the substrate are aligned with additional indicia or indexing bars. Although describing alignment of a mask to a substrate, this patent does not discuss the measurement of misalignment of a first layer relative to a second superimposed layer.

The state of the art for measuring photomask alignment in integrated circuit manufacturing is described in the 1977 IEEE International Electronic Devices Meeting Digest in an article entitled "A Comparison of Electrical and Visual Alignment Test Structures for Evaluating Photomask Alignment in Integrated Circuit Manufacturing", by T. J. Russell, T. F. Leedy, and R. L. Mattis. The optical technique includes a wedge from one mask level superimposed upon a rectangular form from a previous mask level as shown in FIG. 1. The displacement D of the crossing points of the wedge and the triangle is proportional to the misalignment of the two levels. The electrical technique, which was considered superior and is illustrated in FIG. 2, uses the principle of a linear potentiometer to measure the misalignment between the diffusion mask level and the contact aperture mask level. The resistances $R_1$ and $R_2$ are determined by measuring the voltage difference between $V_2$ and $V_3$, and $V_3$ and $V_4$ with currents applied at I through the diffused region. For perfect alignment, $R_1$ is equal to $R_2$; the misalignment is equal to one half the distance L between $V_1$ and $V_2$ times the difference between $R_1$ and $R_2$ divided by R. As indicated in the paper, although the electrical technique removes subjective error of the optical technique and is considerably faster, the resolution is not as good.

Thus, there exists a need for a technique which overcomes the problem of the prior art.

SUMMARY OF THE INVENTION

An object of the invention is to provide a method of measuring misalignments between levels on a wafer which offers high resolution and may be performed quickly.

Another object of the present invention is to provide an optical technique which removes subjective error of the human observer.

Still another object of the present invention is to provide a method of measuring misalignment between levels on a wafer which occupies the minimum amount of space on the wafer and which is compatible with present processing techniques.

An even further object of the present invention is to provide an optical technique for measuring misalignment between levels on a wafer with maximum resolution and minimum subjective error.

These and other objects are attained by using a vernier technique. The present method includes forming a first pattern on a first layer including indicia spaced at a first interval and including a distinctive reference indicia. A second pattern is formed in a second layer superimposed on the first layer having a second pattern including indicia spaced at a second interval different from the first interval and also including a distinctive reference indicia. The measurement of the misalignment between the two levels is determined by observing the numerical position of the most closely aligned respective overlapping indicia from the first and second patterns relative to the reference indicia and multiplying the numerical position by the difference in the interval between the first and second patterns. The resolution is a function of the difference in spacing between the first and second patterns and not the resolution of the microscope.

These and other objects of the invention will become apparent from the following detailed description of the invention when considered in conjunction with the accompanying drawings.

DESCRIPTION OF THE PREFERRED EMBODIMENTS

Figure 1:
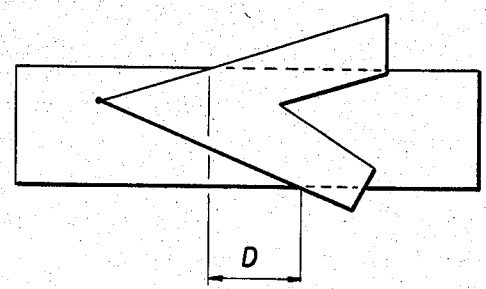
FIG. 1 illustrates an optical misalignment technique of the prior art.
Figure 2:
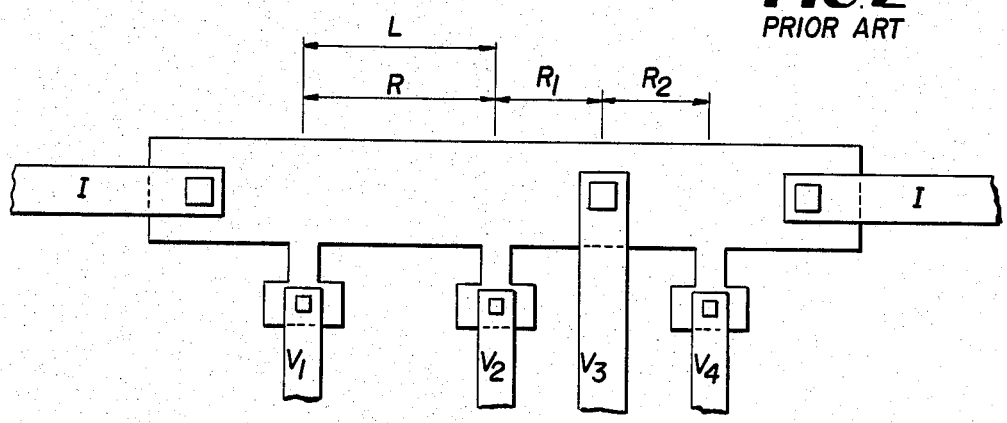
FIG. 2 illustrates an electrical measurement scheme for misalignment of the prior art.
Figure 3:
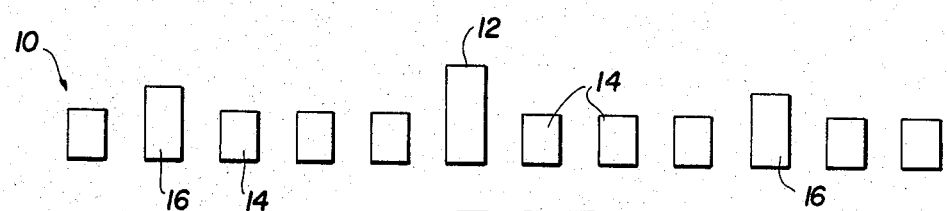
FIG. 3 illustrates a first level pattern incorporating the principles of the present invention.

According to the present invention, a first pattern 10 is formed on a first level including a distinctive reference indicia 12, a plurality of indicia 14 spaced on either side thereof, and may include further distinctive indicia 16. Indicia 12, 14, and 16 are of equal size and spacing. A second layer is formed superimposed on the first layer and includes a second pattern 20 having a distinctive reference indicia 22 in the center thereof with additional indicia 24 and distinctive indicia 26 spaced on either side thereof. As in the first pattern 10, indicia 22, 24 and 26 are of equal size and uniform spacing. The spacing or interval between the indicia pattern 20 is different form the spacing of the indicia in pattern 10. The resolution of the alignment technique of the present invention is a function of the difference in the spacing of the indicia in pattern 10 and pattern 20.

Figure 4:
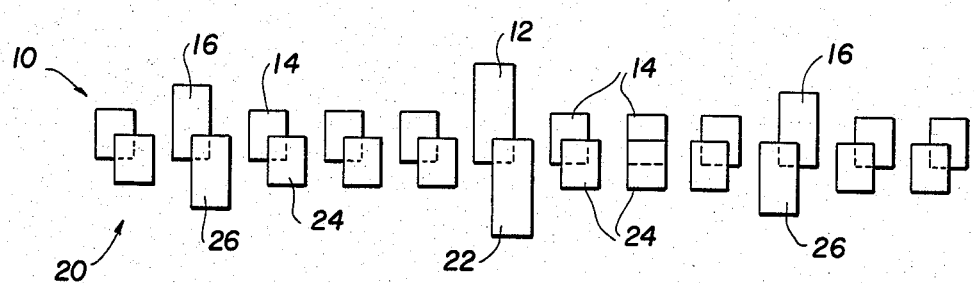
FIG. 4 illustrates a second level pattern overlapping the first level pattern of FIG. 3 according to the principles of the present invention.

As illustrated in FIG. 4, pattern 20 is positioned above and overlapping pattern 10, although not necessarily superimposed. A measurement of the misalignment is performed by observing the most closely aligned respective indicia from patterns 10 and 20. For the example illustrated in FIG. 4, the second set of indicia 14 and 24 to the right of the reference indicia, 12 and 22 are the most closely aligned. Thus, the alignment is equal to the numerical position (which is the position of the most closely aligned indicia relative to the reference indicia) times the difference in spacing between the indicia of pattern 10 and indicia of pattern 20.

By way of example, assume that the indicia 12, 14, 16, 22, 24, and 26 have a width of 4 microns and that the pattern 10 has an indicia to indicia spacing of 4 microns and the indicia pattern 20 has an indicia to indicia spacing of 3.75 microns. Thus, for the example in FIG. 4, the misalignment would be 2 times 4 minus 3.75 microns or 0.5 microns.

As can be seen from the present technique, the subjectivity of the observer is not a factor in the present method, nor is the resolution of the microscope. Also, since the present method deals with patterns on two levels which are offset in the range of a few thousand angstroms to 2 microns, the resolution problem described in U.S. Pat. No. 3,861,798 is avoided. Thus, high resolving power microscopes can be used. Although the present example used indicia with a 4 micron and a 3.75 micron spacing for patterns 10 and 20, respectively, the width of the indicia may be in the range of 2 microns to 20 microns with a relative spacing in the range of 3 to 10 microns and a difference in spacing between patterns 10 and 20 in the range of 0.1 to 0.3 microns. Similarly, although rectangular indicia have been shown, other types of indicia may be used.

Figure 5:
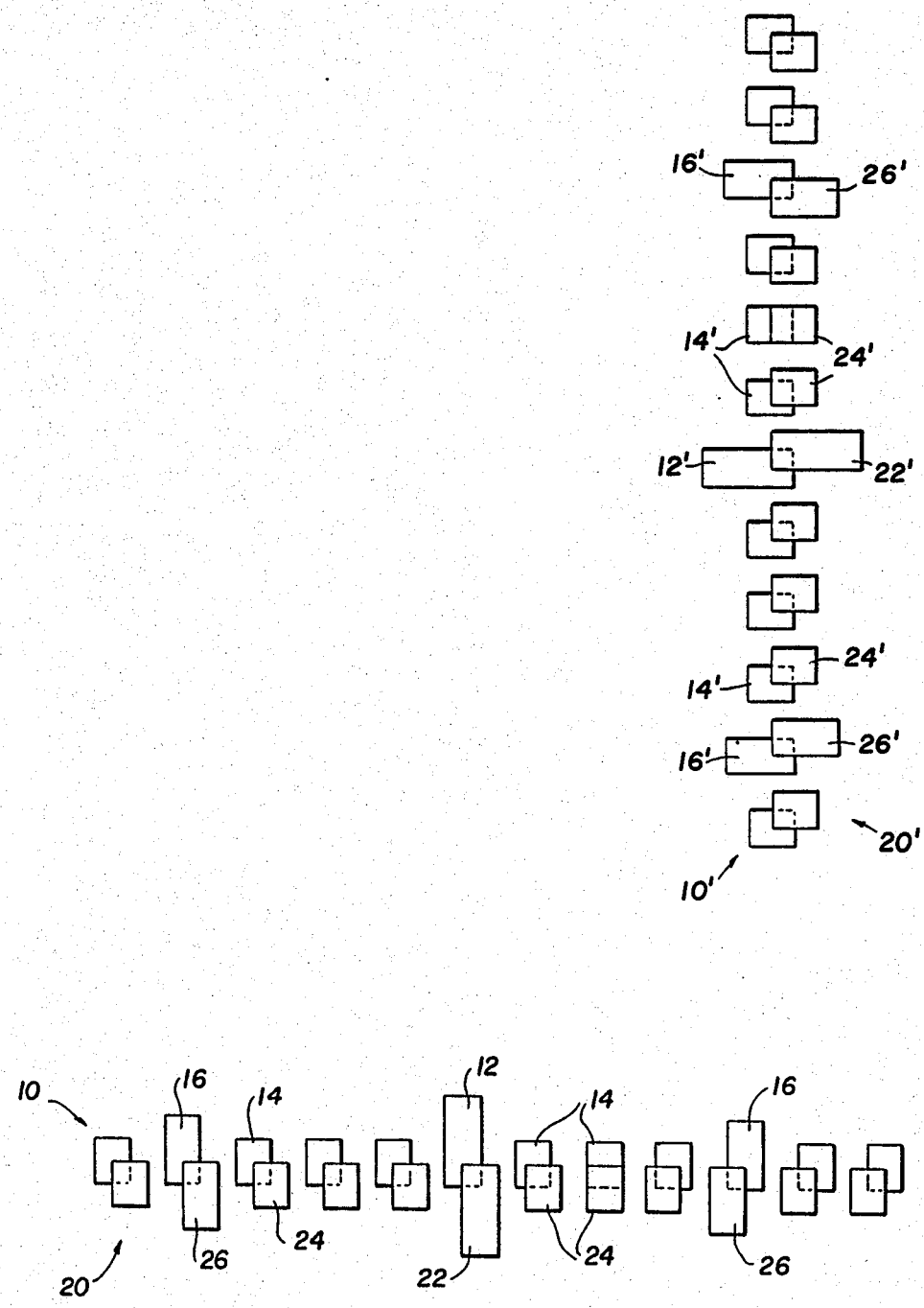
FIG. 5 illustrates an orthogonal pattern with overlapping orthogonal pattern.

Although a single set of patterns 10 and 20 on two separate layers are shown, a second set may be formed having a third pattern on the first layer with and orthogonal to pattern 10 and a fourth pattern on the second layer with and orthogonal to pattern 20 as illustrated in FIG. 5. Thus, misalignment on two axes may be measured. Similarly, a plurality of pairs of patterns as 10 and 20 may be provided on each level and used as a diagnostic tool for analyzing mask run-in run-out problems, wafer warpage effects, aligner non-linearity, etc.

One method for forming indicia of pattern 10 includes incorporating pattern 10 into a mask used for an oxide cut photoresist process, then coating, exposing, developing and oxide etching a semiconductor wafer normally at the stage of manufacture requiring the mask containing pattern 10. The etched wafer will contain replications of pattern 10 etched into the oxide on every integrated circuit chip. This is followed by forming indicia of pattern 20 in a second layer by a similar process or by any other patterning process which results in a permanent pattern being visible on a wafer. Examples of the latter case would be aluminum interconnect photoresist processing, nichrome fuse photoresist processing, and thin film resistor photoresist processing. These processes could also have been used to form the indicia of pattern 10.

These are but two examples of methods of forming the indicia of a pattern in a layer on a substrate. Other methods may be used to form these and other types of indicia. The specific method and type of indicia do not form a portion of the present invention.

From the preceding description of the preferred embodiments, it is evident that the objects of the invention are attained and although the invention has been described and illustrated in detail, it is to be clearly understood that the same is by way of illustration and example only and is not to be taken by way of limitation. The spirit and scope of this invention are to be limited only by the terms of the appended claims.

What is claimed:

1. In a method of measuring misalignment between levels on a substrate including forming alignment indicia on each level during the processing of that level, the improvement comprising:
   forming a first pattern having a plurality of indicia spaced at a first interval and including a first reference indicia on a first level during the processing of said first level;
   forming a second pattern having a plurality of indicia spaced at a second interval different from said first interval and including a second reference indicia on a second level superimposed on said first level with said second pattern overlapping said first pattern during the processing of said second level;
   observing which indicia of said second pattern is most closely aligned with a corresponding indicia of said first pattern; and
   multiplying the numerical position from the reference indicia of the most closely aligned indicia by the difference between the first and second intervals to determine the misalignment between said levels.

2. In a method of measuring misalignment between levels on a substrate including forming alignment indicia on each level during the processing of that level, the improvement comprising:
   forming a first pattern and third pattern orthogonal to said first pattern, each pattern having a plurality of indicia spaced at a first interval and including a first reference indicia on a first level during the processing of said first level;
   forming a second pattern and fourth pattern orthogonal to said second pattern, each pattern having a plurality of indicia spaced at a second interval different from said first interval and including a second reference indicia on a second level superimposed on said first level with said second pattern overlapping said first pattern during the processing of said second level;
   observing which indicia of said second and fourth patterns are most closely aligned with a corresponding indicia of said first and third patterns, respectively; and
   multiplying the numerical position from the reference indicia of the most closely aligned indicia by the difference between the first and second intervals to determine the misalignment between said levels in each orthogonal direction.

3. The method according to claim 2 wherein said first and second patterns each include a plurality of indicia on each side of said reference indicia.

4. The method according to claim 2, wherein said first and second indicia have a width in the range of 2 to 20 microns and said first and second intervals between indicia is in the range of 3 to 10 microns.

5. The method according to claim 2 wherein the difference between said first and second intervals is in the range of 1000 to 3000 angstroms.

* * * * *